United States Patent [19]

Terami et al.

[11] 4,363,136

[45] Dec. 7, 1982

[54] STATION SELECTING APPARATUS

[75] Inventors: Koji Terami, Daito; Isao Fujimoto, Katano, both of Japan

[73] Assignee: Sanyo Electric Co., Ltd., Moriguchi, Japan

[21] Appl. No.: 242,229

[22] Filed: Mar. 10, 1981

[30] Foreign Application Priority Data

Mar. 19, 1980 [JP] Japan ................... 55-35239
May 1, 1980 [JP] Japan ................... 55-59243
May 10, 1980 [JP] Japan ................... 55-62110
May 13, 1980 [JP] Japan ................... 55-63763

[51] Int. Cl.³ .............................................. H04B 1/16
[52] U.S. Cl. ..................................... 455/180; 455/186
[58] Field of Search ............... 455/175, 176, 180, 185, 455/186, 195

[56] References Cited

U.S. PATENT DOCUMENTS 3,505,620  4/1970  Miner ............................. 455/175

Primary Examiner—Marc E. Bookbinder
Attorney, Agent, or Firm—Armstrong, Nikaido, Marmelstein & Kubovcik

[57] ABSTRACT

A station selecting apparatus comprises a preset signal generating circuit comprising a charging/discharging circuit including a parallel connection of a variable resistor and a capacitor and being adapted to generate a pulsive preset signal having a pulse width determined as a function of a discharging time constant of the above described charging/discharging circuit. A semifixed resistor is connected between the variable resistor of the preset signal generating circuit and the ground for the purpose of defining the minimum pulse width of the preset signal and a further semifixed resistor is connected in parallel with the variable resistor for the purpose of defining the maximum pulse width of the preset signal.

9 Claims, 16 Drawing Figures

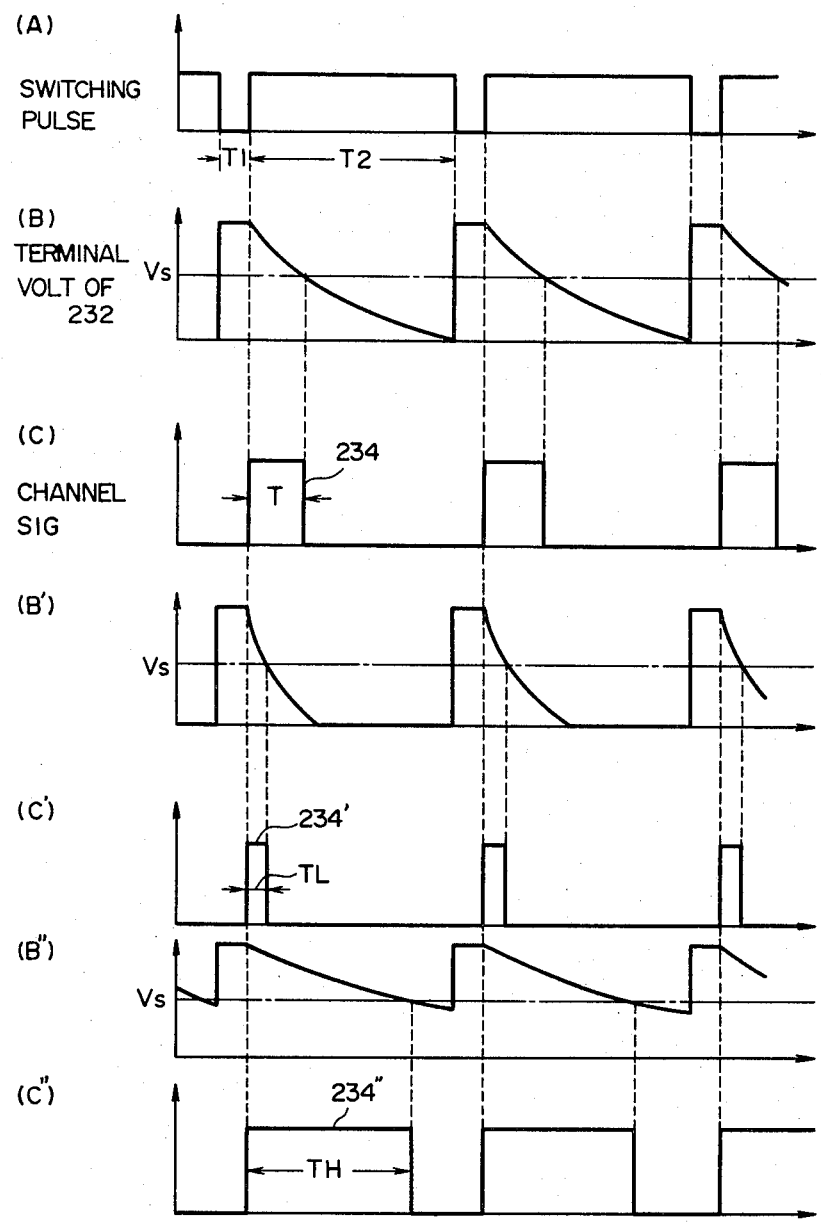

STATION SELECTING APPARATUS

BACKGROUND OF THE INVENTION

1. Field of the Invention

The present invention relates to a station selecting apparatus. More specifically, the present invention relates to a preset circuit for presetting a channel signal in a station selecting apparatus of a voltage synthesizer type in a television receiver, for example.

2. Description of the Prior Art

FIG. 1 is a block diagram showing one example of a tuner of a television receiver which constitutes the background of the invention. Since such television tuner is well known to those skilled in the art, the same will be described in brief to the extent required for description of the present invention. A tuner 100 is connected to a VHF antenna 1 and UHF antenna 2. A television signal received by the VHF antenna 1 is applied to a VHF high frequency amplifier 101 to be amplified and the output therefrom is applied to a VHF mixer 103. The VHF mixer 103 serves to mix the VHF television signal with a local oscillation signal obtained from a VHF local oscillator 105, thereby to convert the same into a VHF intermediate frequency signal. On the other hand, a UHF television signal from the UHF antenna 2 is applied to a UHF high frequency amplifier 102 to be amplified and the amplified output is applied to a UHF mixer 104. The UHF mixer 104 serves to mix the UHF television signal with a local oscillation signal obtained from a UHF local oscillator 106, thereby to convert the same into a UHF intermediate frequency signal. The UHF intermediate frequency signal is amplified by a UHF intermediate frequency amplifier 108 and the output therefrom is applied to the VHF mixer 103. Accordingly, the VHF mixer 103 serves as a UHF intermediate frequency amplifier on the occasion of reception of the UHF band. The output obtained from the VHF mixer 103 is applied to an intermediate frequency amplifier circuit of a subsequent stage, not shown. Each of the VHF local oscillator 105 and the UHF local oscillator 106 comprises a voltage controlled variable reactance device such as a variable capacitance diode for the purpose of selecting a desired channel of a desired frequency band. To that end each of the VHF local oscillator 105 and the UHF local oscillator 106 is supplied with a tuning voltage Vt from a channel selecting apparatus 200. At the same time each of these circuits 105 and 106 is supplied with band selecting voltages BL, BH and BU from the apparatus 200.

FIG. 2 is a block diagram showing one example of the channel selecting apparatus 200 which constitutes the background of the invention. The apparatus 200 is structured to be of a voltage synthesizer type and is also structured to be presettable. The present invention is directed to an improvement in a channel selecting apparatus of a presettable voltage synthesizer type. Although such channel selecting apparatus 200 is well known to those skilled in the art, the same will be briefly described to the extent required for description of the present invention. A control unit 21 is implemented by an integrated circuit of such as Model No. TC9002, manufactured by Tokyo Shibaura Electric Co., Ltd., Japan. A memory 22 is connected to the control unit 21 for the purpose of storing a channel signal being preset by a preset circuit 23. The memory 22 may be implemented by a non-volatile memory MNOS of such as No. TMM 841 manufactured by Tokyo Shibaura Electric Co., Ltd., Japan, whereby a stored content is kept stored even after a power supply is turned off. The memory 22 serves to store not only a channel signal but also band information of the UHF band, VHF low band or VHF high band. The preset circuit 23 comprises a charging/discharging circuit including a parallel connection of a variable resistor 231 and a capacitor 232. A charging/discharging operation of the charging/discharging circuit is controlled by a switching field effect transistor 233 included in the control unit 21. More specifically, a switching pulse as shown in FIG. 3A is applied to the field effect transistor 233, so that the field effect transistor 233 is turned on during the period T1 of the switching pulse and the field effect transistor 233 is turned off during the period T2 of the switching pulse. Accordingly, during a time period when the field effect transistor 233 is turned on, the capacitor 232 is charged with a current from a voltage source Vdd and the electric charge in the capacitor 232 is discharged to a reference potential, i.e. the ground through the variable resistor 231 during the time period when the field effect transistor 233 is turned off. Accordingly, the terminal voltage of the capacitor 232 changes as shown in FIG. 3B. The terminal voltage of the capacitor 232 is sliced with a proper threshold value Vs by means of a slicing circuit, not shown. Accordingly, a channel signal 234 obtained from the preset circuit 23 is obtained as pulse shaped as shown in FIG. 3C.

Contacts L, H and U of a band switch 24 are further connected to the control unit 21, so that these contacts L, H and U may correspond to the VHF low band, VHF high band and UHF band, respectively. A common contact of the band switch 24 is connected to an appropriate voltage, say 10 V, through a diode for preventing a reverse directional current. Accordingly, by selecting a particular contact by the band switch 24, a corresponding band is selected. A memory switch 25 is connected to the control unit 21. The memory switch 25 is operated to write the channel signal 234 obtained from the preset circuit 23 and the band signal obtained from the band switch 24 in the memory 22 on the occasion of the preset mode.

A channel selecting switch circuit 26 and a channel selection indicator circuit 27 are further connected to the control unit 21. The channel selecting switch circuit 26 comprises a plurality (n) of channel switches 261, 262, ..., 26n and the indicator circuit 27 comprises a plurality (n) of indicator lamps 271, 272, ..., 27n. The indicator lamps 271, 272, ..., 27n each may be a light-emitting diode. Each of the light-emitting diodes 271 to 27n is responsive to operation of a corresponding one of the switches 261 to 26n to be supplied with a driving voltage of an appropriate voltage say 10 V, thereby to indicate that the corresponding channel is selected.

Now an outline of the preset mode of the FIG. 2 channel selecting apparatus 200 will be described. Any one of the channel switches 261 to 26n corresponding to a channel which is to be preset is first turned on. As a result an address of the memory 22 where preset data is to be written is designated. Then a band out of the VHF low band, VHF high band and UHF band to which the desired channel pertains is set by the band switch 24. The band information is entered to the control unit 21 from an appropriate input terminal. The variable resistor 231 is adjusted to attain a picture of the best quality in the desired channel. More specifically, the discharging time T (FIG. 3) is changed by adjusting the variable resistor 231, whereby a tuning operation is effected to the desired channel. Then the memory switch 25 is operated. Accordingly, the band information from the band switch 24 as well as the channel signal 234 is stored in the address of the memory 22 designated by any one of the channel switches 261 to 26n. Meanwhile, the channel signal 234 may be written in the memory 22 as a binary code corresponding to the pulse width T (FIG. 3). Thus the preset operation is completed.

Then a tuning voltage Vt is applied to the tuner 100 (FIG. 1) from the channel signal and the band information preset in the memory 22, while a tuning voltage generator 29 and a band selection voltage generator 28 are connected to the control unit 21 for the purpose of providing a band selecting voltage BL, BH or BU. The tuning voltage generator 29 is supplied with a PWM signal read from the memory 22 (which is a signal including channel information in pulse width as in the case of the channel signal 234 shown in FIG. 3C). The band selecting voltage generator 28 is supplied with band information read from the memory 22. Now referring to FIGS. 4 and 5, the tuning voltage generator 29 will be briefly described. The tuning voltage generator 29 comprises a voltage converting circuit 291 and a low pass filter 292. The PWM signal from the control unit 21 is applied to the voltage converting circuit 291 as shown in FIG. 5A. The voltage converting circuit 291 converts the PWM signal to a predetermined value Vz by means of a zener diode, thereby to provide a voltage signal as shown in FIG. 5B. The voltage signal is smoothed by means of a low-pass filter 292, thereby to provide a direct current tuning voltage Vt as shown in FIG. 5D. Meanwhile, FIG. 5C shows a voltage wave form at the point 252a of the low-pass filter 292. Such tuning voltage generator 29 is also well known to those skilled in the art.

The tuning voltage Vt obtained from the tuning voltage generator 29 is applied to the tuner 100 shown in FIG. 1, whereby the tuner 100 is tuned to a desired channel corresponding to the tuning voltage Vt.

On the other hand, it has been known that in Europe, for example, the tuner 100 is generally adapted to exhibit a characteristic as shown in FIG. 6. More specifically, in Europe the standard system has been adopted in which the VHF low band comprises Channels E2 to E4, the VHF high band comprises Channels E5 to E12 and the UHF band comprises Channels E21 to E69. In a tuner adaptable for such standard, the receivable lowest frequency in the VHF low band, i.e. Channel E2 is set to be capable of receiving the channel in the case where the tuning voltage is 3 V, for example. However, a television tuner must be able to select assuredly Channel E2 under any conditions. Therefore, conventionally the channel selecting apparatus 200 (FIG. 2) has been adapted to provide to the tuner 100 (FIG. 1) a sufficiently small tuning voltage Vt as small as say 0.2 to 0.3 V as compared with the above described 3 V. Accordingly, a conventional television tuner has in an ordinary state a receivable frequency range extended as shown by the dotted line in FIG. 6 toward a lower frequency region over the required receivable frequency range. Likewise, the other bands have also been designed such that the required channels can be assuredly received with a considerable allowance.

However, recently it has come to be legally required that a receivable frequency range is very narrowly restricted for the purpose of effective utilization of an electric wave and maintenance of secrecy in communication. In West Germany, for example, FTZ provides that an allowable range of shift outside the frequency range over the upper limit and the lower limit of each frequency band must be basically smaller than 300 kHz, with an exception that a shift outside the frequency range by 8 MHz in the upper limit and by 7 MHz in the lower limit is merely allowed in the receiving frequency band of 47 MHz to 800 MHz. Likewise, as regards the television broadcasting in Canada as shown in FIG. 7, DOC requires that any frequency regions lower than channel A7 and higher than channel A13, except for CATV Channels I and J, must not be receivable by ordinary television receivers.

Under the circumstances as a simple approach to satisfy the above described strict regulations, one might think of adjusting the respective tuning elements, not shown, so as to make the lower limit frequencies of the respective bands aligned with the lower limit of the variable range of the tuning voltage and to make the upper limit frequencies of the respective bands aligned with the maximum value of the variable range of the tuning voltage. However, generally in mass production of television tuners a diversification is caused in a receiving frequency characteristic with respect to the tuning voltage for each of the tuner sets. More specifically, referring to FIG. 6, as regards the points a to f at the upper end and the lower end of the respective frequency bands U, H and L, diversifications are caused in the range as shown as A to F, respectively. On the other hand, the variable range of the tuning voltage Vt also involves a diversification for each of the channel selecting apparatuses. Therefore, the above described adjustment of the tuning frequency cannot be made only in a tuner itself and accordingly such adjustment must be made of the tuner in combination with a channel selecting apparatus. Such adjustment is extremely tiresome in manufacture. In addition, a problem is involved that since any channel signal can be set through adjustment of the variable register 231 (FIG. 2) in a presettable tuner to which the present invention is directed even a frequency which must be unreceivable is made receivable in a television receiver when an operator sets a channel signal outside the legal restriction as described above. In other words, in case of such presettable station selecting apparatus, even such possibility of presetting by an operator need be taken into consideration. Thus, any of the conventional approaches could not achieve the effect to the satisfaction.

SUMMARY OF THE INVENTION

Briefly described, the present invention comprises a station selecting apparatus adapted for restricting a time constant of a charging/discharging circuit for generating a presetting channel signal and thus a tuning voltage, whereby any frequencies outside the range restricted by a legislation as described above cannot be tuned in spite of any presetting operation by an operator. Therefore, according to the present invention, a station selecting apparatus is provided which is assuredly adaptable to a restriction of the frequency range by a simple and minor change of a conventional station selecting apparatus and without degrading any performance thereof. Since such station selecting apparatus is implemented in a simple structure, manufacture and adjustment can be made with ease and mass productivity is excellent.

In a preferred embodiment of the present invention, a tuner is designed and adjusted such that a tuning voltage corresponding to the lowest or the highest channel of a band requiring restriction in the lower limit or the upper limit of the tuning voltage may become lower or higher than the tuning voltage corresponding to the lowest or the highest channel of the other band and a semifixed resistor is connected in series or parallel with a variable resistor constituting a charging/discharging circuit for the purpose of restricting the lower limit or the upper limit of the time constant thereof, thereby to define the lower limit or the upper limit of the tuning voltage. In the embodiment shown, only a single semifixed resistor is merely connected, with the resultant advantage that the structure is extremely simple.

In another preferred embodiment of the present invention, a second semifixed resistor is connected in parallel or series with the variable resistor constituting the charging/discharging circuit for the purpose of restricting the upper limit or the lower limit of the time constant thereof, thereby to define the upper limit or the lower limit of the tuning voltage. According to the embodiment in description, restriction of the upper limit or the lower limit of the tuning voltage can be achieved with a simple circuit configuration.

In a further embodiment of the present invention, the above described one or two semifixed resistors are rendered effective responsive to a selecting operation of a band requiring restriction of the lower limit and/or the upper limit. According to the preferred embodiment in description, adjustment of a reception characteristic for each frequency band in a tuner can be entirely dispensed with.

Accordingly, a principal object of the present invention is to provide an improved station selecting apparatus which is capable of presetting a given restricted tuning voltage (a channel signal corresponding thereto) with a simple structure.

Another aspect of the present invention resides in a station selecting apparatus which is adaptable to restriction by a legislation without adjustment of a receiving frequency characteristic with respect to a tuning voltage to a specific manner on the part of a tuner.

A further aspect of the present invention resides in a station selecting apparatus which is excellent in mass productivity and is adaptable to restriction by a legislation.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 9 corresponds to FIG. 3 and is a graph showing the waveforms for explaining the operation of the FIG. 8 diagram;

DESCRIPTION OF THE PREFERRED EMBODIMENTS

Figure 1:
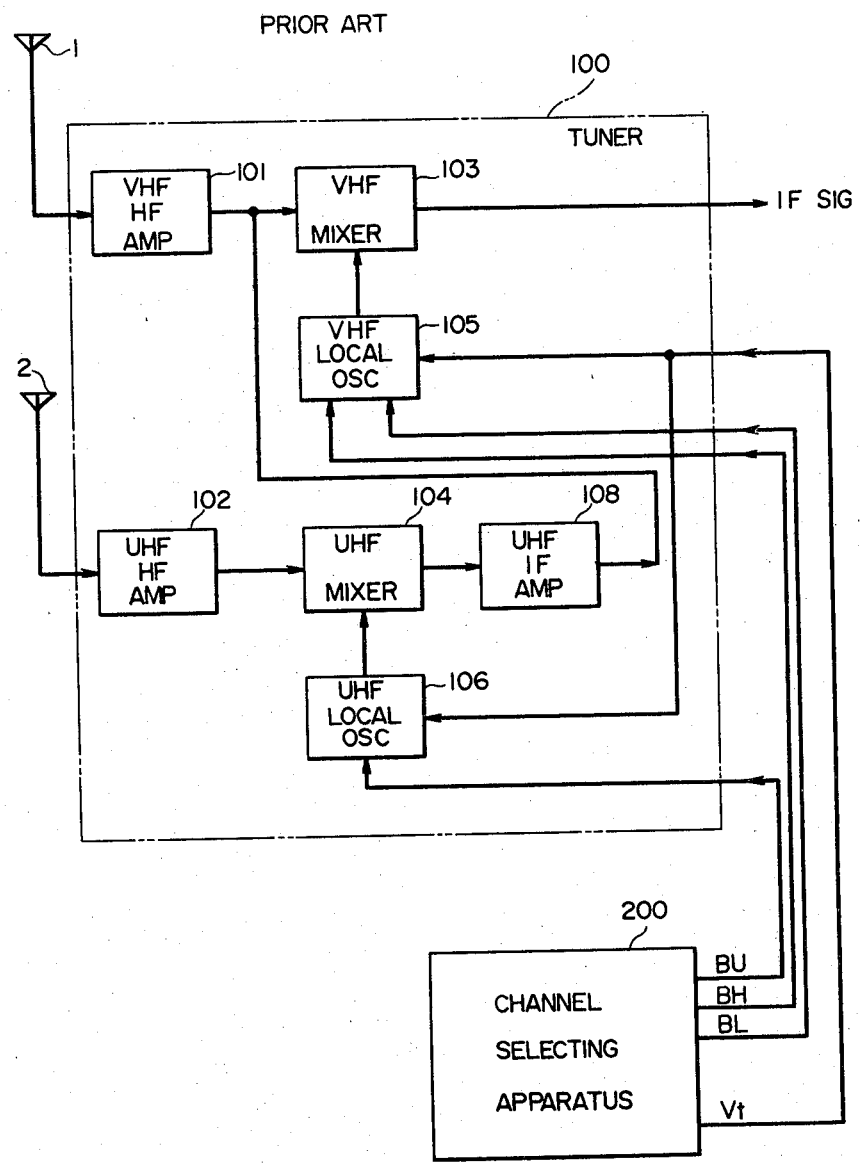
FIG. 1 is a block diagram showing a general television tuner which constitutes the background of the invention.
Figure 2:
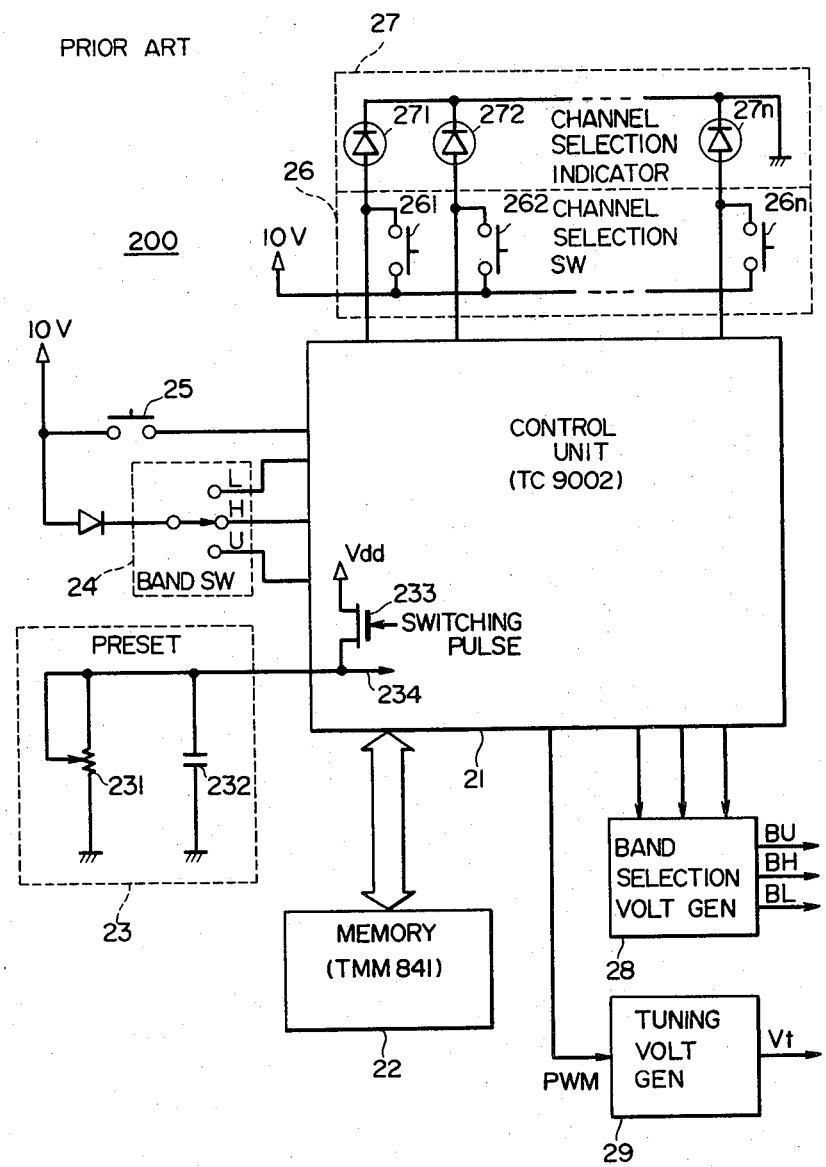
FIG. 2 is a block diagram showing one example of a conventional channel selecting apparatus which constitutes the background of the invention and in which the present invention can be advantageously employed.
Figure 3:
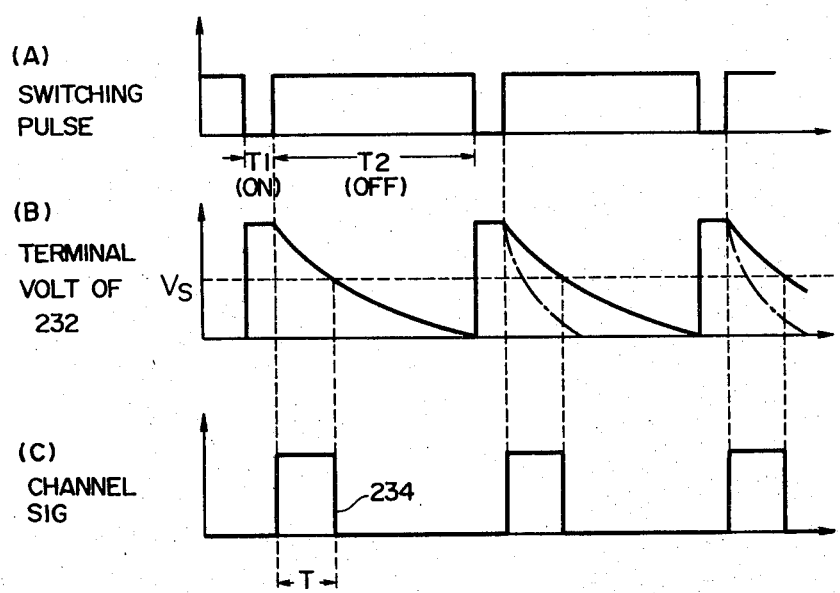
FIG. 3 is a graph showing waveforms for explaining generation of a preset signal (channel signal)
Figure 8:
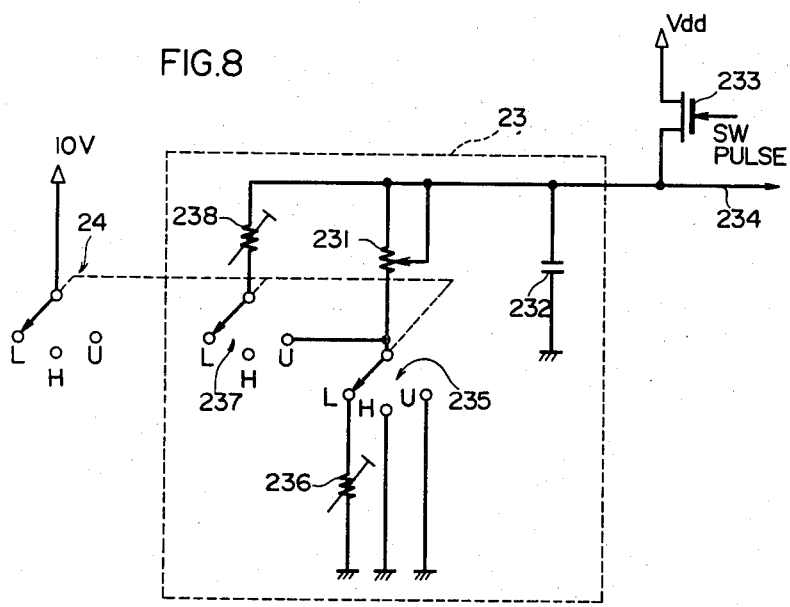
FIG. 8 is a schematic diagram showing one embodiment of the present invention.

FIG. 8 is a schematic diagram showing a major portion of one embodiment of the present invention. Referring to FIG. 8 et seq, like portions have been denoted by the same reference characters used in FIG. 2 and a description thereof will be omitted. It is pointed out in advance that any of the components shown in FIG. 2 but not shown in FIG. 8 are structured in substantially the same manner as that in FIG. 2.

The FIG. 8 embodiment is structured to restrict the lower limit frequency (channel) of the VHF low band and the upper limit frequency (channel) of the UHF band so as to meet the FTZ regulation. More specifically, a switch 235 is connected to one end of the variable resistor 231 constituting the charging/discharging circuit. The switch 235 comprises three contacts L, H and U and is structured to be turnable in association with the bandswitch 24. A semifixed resistor 236 is connected between the contact L of the switch 235 and the ground (the reference potential) and the other contacts H and U are directly connected to the ground. Furthermore, a semifixed resistor 238 is connected through a switch 237 in parallel with the variable resistor 231. More specifically, the switch 237 also comprises three contacts L, H and U and is structured to be turnable in association with the bandswitch 24, as in the case of the previously described switch 235 and the contact U is connected to one end of the variable resistor 231, while the remaining contacts L and H are opened. The other end of the variable resistor 231 is connected through the semifixed resistor 238 to a common contact of the switch 237.

Figure 10:
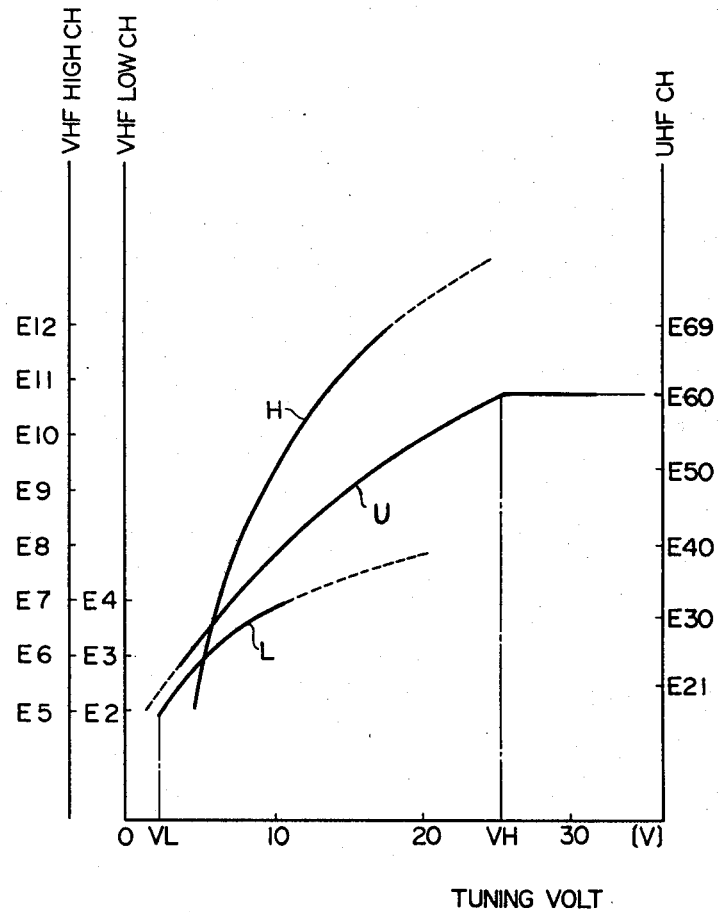
FIG. 10 is a graph showing a receiving frequency (channel) characteristic with respect to a tuning voltage by taking an example of a European television receiver for explaining the effect of the FIG. 8 embodiment.

According to such structure, when the VHF low band is selected by the bandswitch 24, accordingly both of the switches 235 and 237 are turned to the contact L. Accordingly, it follows that the semifixed resistor 236 is connected in series with the variable resistor 231. In such a state, the variable resistor 231 is adjusted so that the resistance value may be minimal, and then the semifixed resistor 236 is adjusted. Then the tuning voltage Vt obtained from the tuning voltage generator 29 (FIG. 2) is varied. The pulse width TL (FIG. 9(C′)) of the channel signal 234 is set such that the tuning voltage Vt thus obtained may be VL (FIG. 10: approximately 1.5 V). More specifically, when the resistance value of the variable resistor 231 is made minimal, the charging time constant of the charging/discharging circuit becomes dependent only on approximately the resistance value of the semifixed resistor 236. Accordingly, by properly setting the resistance value of the semifixed resistor 236, the pulse width TL of the channel signal 234′ and thus the tuning voltage VL is set.

When the UHF band is selected by the channel switch 24, accordingly both of the switches 235 and 237 are turned to the contact U. Accordingly the semifixed resistor 238 is connected in parallel with the variable resistor 231. The variable resistor 231 is adjusted so that the resistance value may be the maximum in such a state and thereafter the semifixed resistor 238 is adjusted. Then the output voltage from the tuning voltage generator 29, i.e. the tuning voltage Vt is changed and therefore the pulse width TH (FIG. 9(C″)) of the channel signal is set such that the tuning voltage may be VH (FIG. 10: approximately 25 V).

Thus, the tuning voltages VL and VH are restricted. More specifically, the semifixed resistors 236 and 238 in the FIG. 8 embodiment are different from the variable resistor 231 and has been made unoperable or unadjustable in an ordinary state. Accordingly, even if an operator usually makes adjustment so that the resistance value of the variable resistor 231 may be minimal in presetting the lower limit frequency of the VHF low band, the channel signal preset in the memory 22 (FIG. 2) does not become lower than the minimum pulse width TL shown in FIG. 9(C′). Likewise, even if the variable resistor 231 is adjusted such that the resistance value may become the maximum in presetting the upper limit frequency of the UHF band, the channel signal being preset in the memory 22 does not become larger than the maximum pulse width TH shown in FIG. 9(C″). Accordingly, a voltage lower or higher than the voltage VL or VH is not supplied from the tuning voltage generator 29, i.e. from the station selecting apparatus to the tuner 100. Thus, according to the FIG. 8 embodiment, the requirement of the FTZ is satisfied with ease by a simple structure (see FIG. 10).

Figure 11:
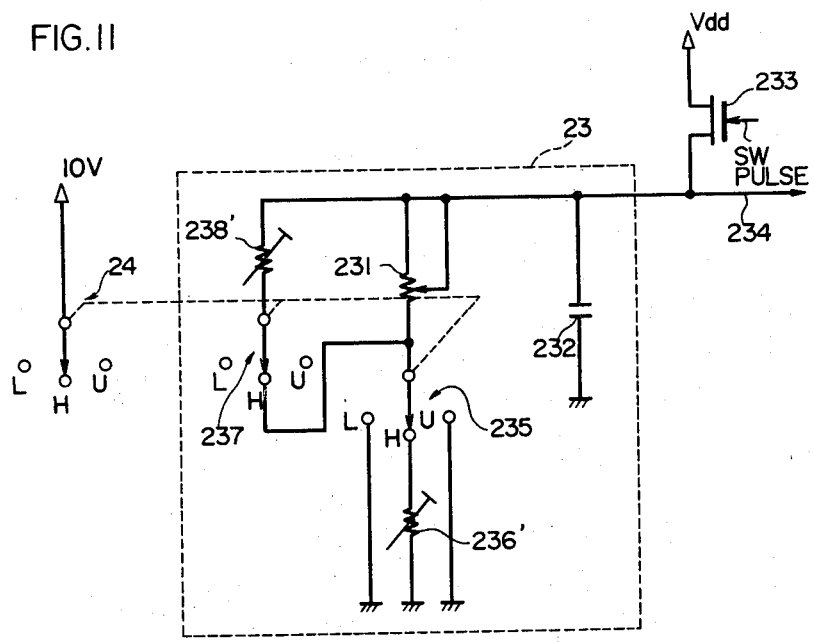
FIG. 11 is a schematic diagram showing a major portion of another embodiment of the present invention.
Figure 12:
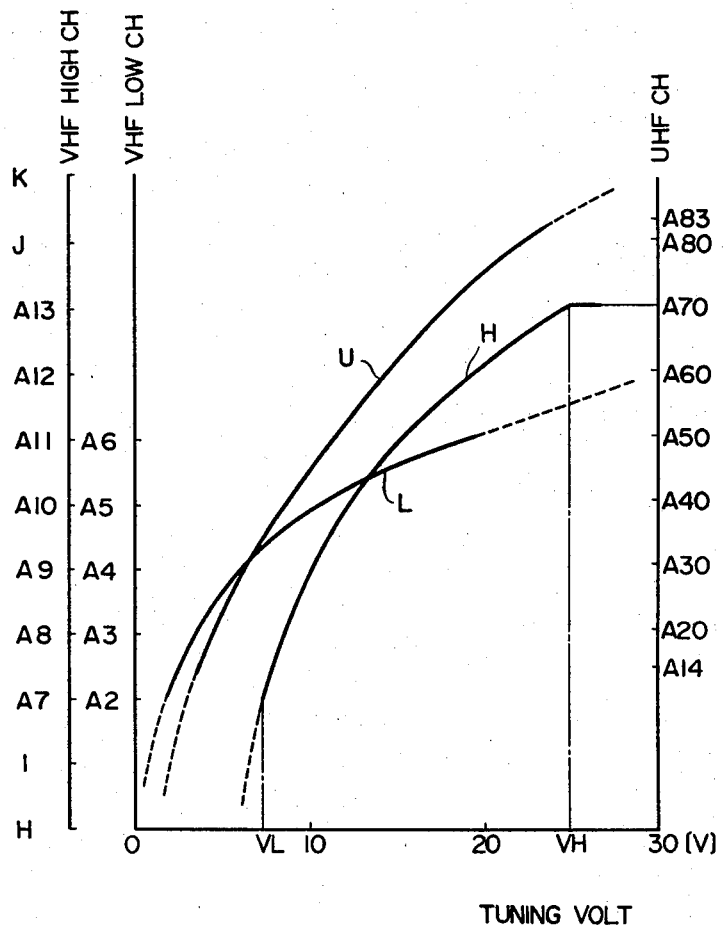
FIG. 12 is a graph showing a receiving frequency (channel) characteristic with respect to a tuning voltage by taking an example of a Canadian television receiver for explaining the effect of the FIG. 11 embodiment.

FIG. 11 is a schematic diagram of a major portion of another embodiment of the present invention. The FIG. 11 embodiment is adapted to restrict the frequency of the upper and lower limits of the VHF high band so as to be adaptable to the requirement of the DOC. Therefore, according to the embodiment shown, when the bandswitch 24 is turned to the VHF high band, accordingly a semifixed resistor 236′ is connected in series with the variable resistor 231 and a semifixed resistor 238′ is connected in parallel with the variable resistor 231 by means of the switches 235 and 237. The operation and the adjusting way of the semifixed resistors 236′ and 238′ may be substantially the same as those described previously in conjunction with the FIG. 8 embodiment. More specifically, according to the FIG. 11 embodiment, the minimum tuning voltage VL (approximately 6 to 7 V) and the maximum tuning voltage VH (approximately 25 V) in the VHF high band shown in FIG. 12 are restricted.

Figure 13:
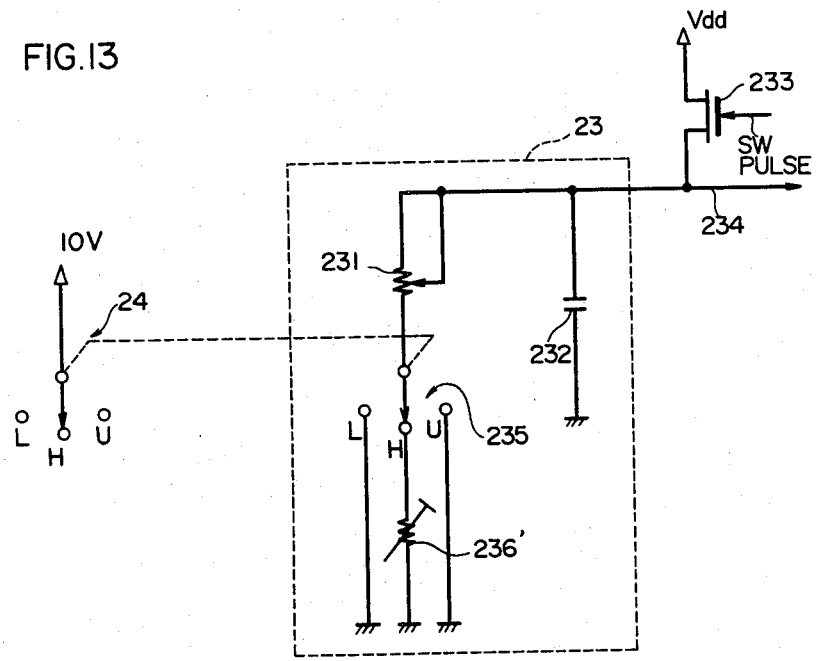
FIG. 13 is a schematic diagram showing a major portion of still a further embodiment of the present invention.

FIG. 13 is a schematic diagram showing a major portion of a further embodiment of the present invention. The FIG. 13 embodiment is adapted to satisfy the DOC regulation and is aimed to restrict the tuning voltage to VL (FIG. 12) in the lower limit of the VHF high band. The embodiment shown is adapted to define the minimum pulse width of the channel signal on the occasion of presetting the VHF high band, as in the case of the FIG. 11 embodiment. On the other hand, by making adjustment such that the frequency higher by 2 MHz than channel A13 can be received when the tuning voltage Vt is 30 V in the tuner, the upper limit frequency (channel) of the VHF high band can receive only Channel J of the CATV band in 30 V which is the upper limit of a diversification range of the voltage Vz, as a function of the zener diode (FIG. 4), with the result that the DOC regulation is fully satisfied.

Figure 14:
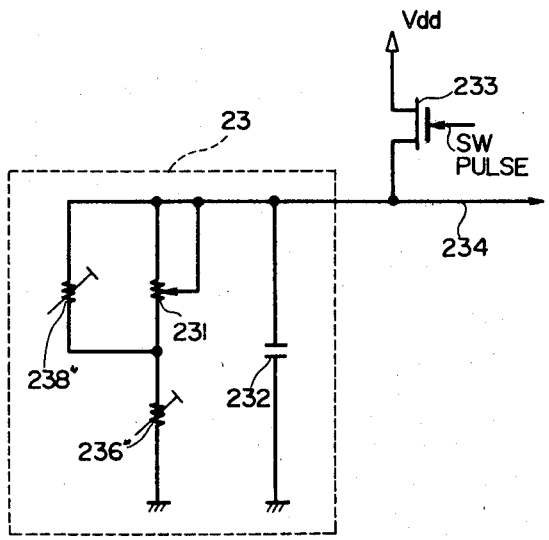
FIG. 14 a schematic diagram of a major portion of still a further embodiment of the present invention.

FIG. 14 is a schematic diagram showing a major portion of still a further embodiment of the present invention. The embodiment shown is aimed to satisfy the FTZ regulation. More specifically, the minimum pulse width of the channel signal is defined by a semifixed resistor 236″ connected in series with the variable resistor 231 and the maximum pulse width of the channel signal is defined by a semifixed resistor 238″ connected in parallel with the variable resistor 231. As a result, the minimum value VL (FIG. 10) and the maximum value VH (FIG. 10) of the tuning voltage are defined.

Figure 6:
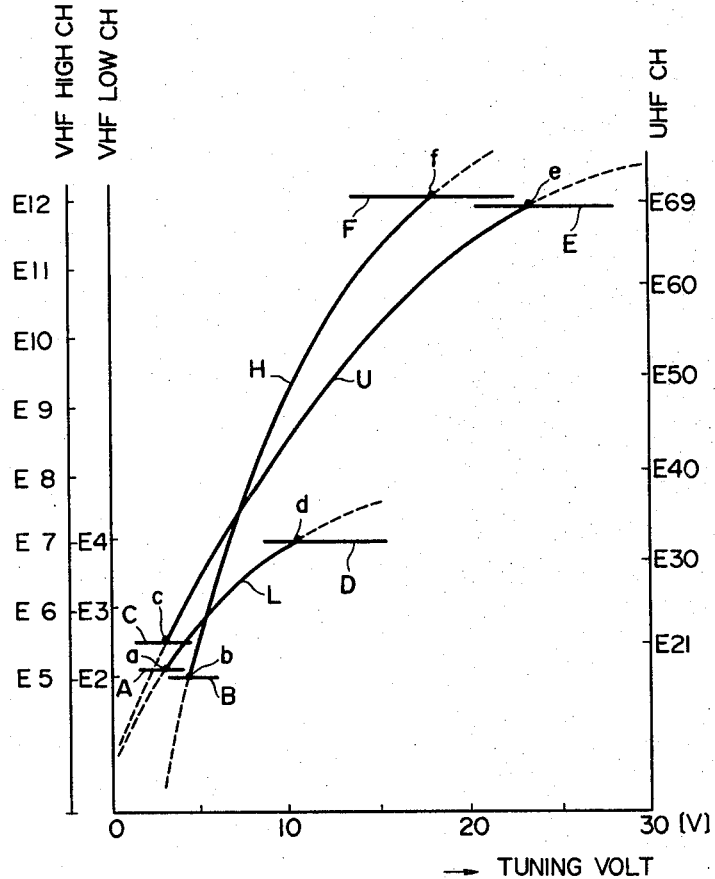
FIG. 6 is a graph showing a receiving frequency (channel) characteristic with respect to a tuning voltage in a conventional television receiver in accordance with the standard in Europe.
Figure 7:
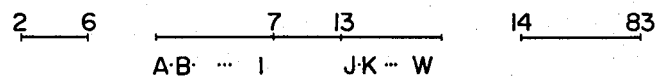
FIG. 7 is a graph for explaining the frequency bands in Canada.

Meanwhile, a tuner receiving the tuning voltage Vt from the channel selecting apparatus of the FIG. 14 embodiment is subject to the requirement that the tuning voltage corresponding to the minimum frequency of the VHF low band is lower than the tuning voltage corresponding to the minimum frequency of the other bands and the tuning voltage corresponding to the maximum frequency of the UHF band is higher than the tuning voltage corresponding to the maximum frequency of the other bands, as in the case of a conventional tuner as shown in FIG. 6. Such requirements can be simply satisfied by a general conventional television tuner.

Figure 4:
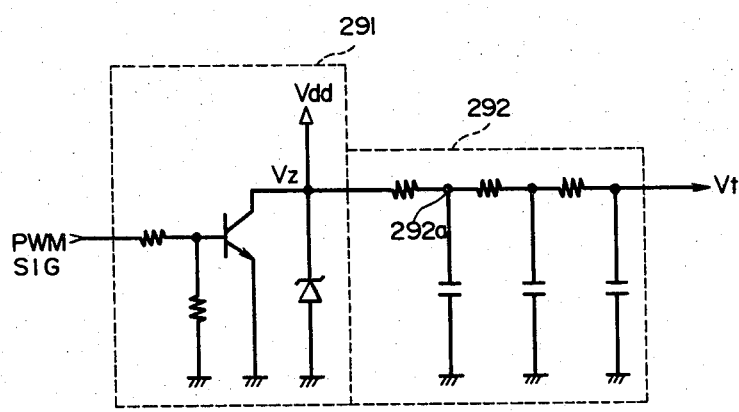
FIG. 4 is a schematic diagram showing one example of a tuning voltage generating circuit.
Figure 5:
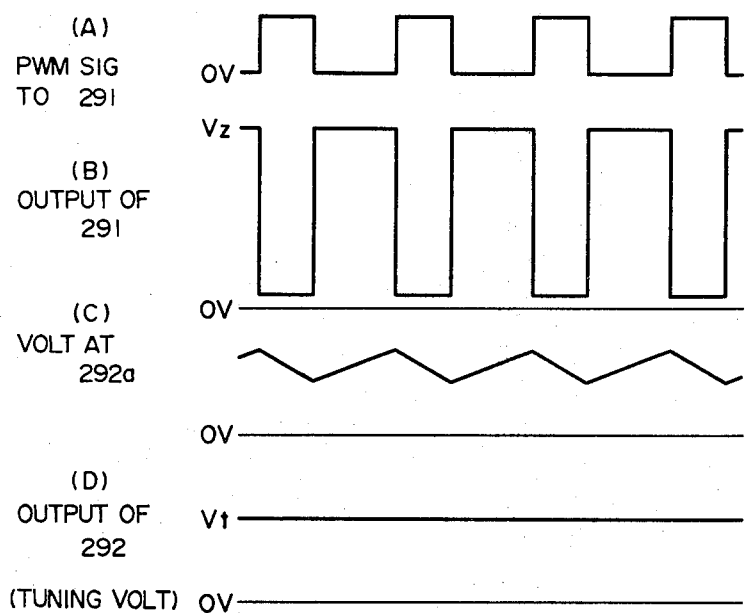
FIG. 5 is a graph showing waveforms for explaining an operation of the FIG. 4 diagram.
Figure 15:
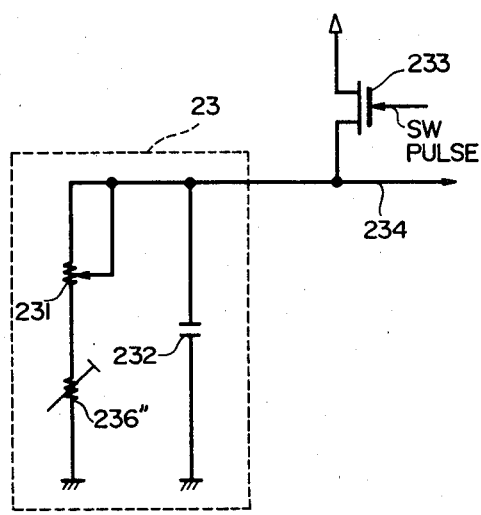
FIG. 15 is a schematic diagram showing a major portion of still another embodiment of the present invention.
Figure 16:
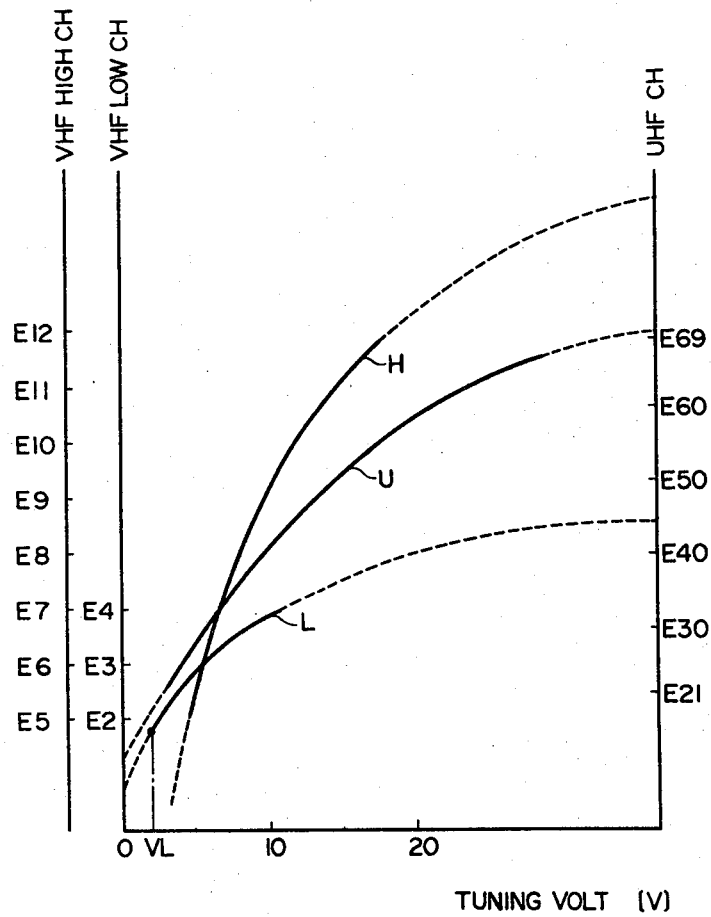
FIG. 16 is a graph showing a receiving frequency (channel) characteristic with respect to a tuning voltage by taking an example of a European television receiver for explaining the effect of the FIG. 15 embodiment.

FIG. 15 is a schematic diagram showing a major portion of another embodiment of a most simple structure in accordance with the present invention. In the embodiment shown, only the semifixed resistor 236‴ is connected to the variable resistor 231, as compared with the FIG. 14 embodiment. Accordingly, the FIG. 15 embodiment serves to restrict the lower limit frequency (channel) of the VHF low band with the semifixed resistor 236‴. On the other hand, the upper limit frequency (channel) of the VHF high band can be restricted by the characteristic of a voltage controlled variable reactance device such as a variable capacitance diode generally employed. More specifically, a common variable capacitance diode exhibits little capacitance variation when the voltage exceeding 25 V is applied and accordingly the upper limit frequency of the UHF band can be restricted only by a voltage limiting function of the zener diode (FIG. 4).

Meanwhile, it is apparent that both the FIG. 14 embodiment and the FIG. 15 embodiment can be advantageously employed also for the purpose of satisfying the DOC regulation. In such case, adjustment is made on the part of a tuner such that the tuning voltage corresponding to the lowest frequency of the VHF high band may be lower than the tuning voltage corresponding to the lowest frequency of the other bands and the tuning voltage corresponding to the maximum frequency of the VHF high band may be higher than the tuning voltage corresponding to the maximum frequency of the other bands.

According to the experimentation made by the inventors, in order to attain VL=1.5 V and VH=25 V in the FIG. 8 embodiment, the voltage Vdd=10 V, the capacitor 232=0.4 μF, the variable resistor 231=100 kΩ, the semifixed resistor 236=10 kΩ (after adjustment 5 kΩ), and the semifixed resistor 238=500 kΩ (after adjustment 300 kΩ) were selected. Furthermore, in order to attain VL=6 to 7 V and VH=25 to 26 V in the case of the FIG. 11 embodiment, the voltage Vdd=10 V, the capacitor 232=0.4 μF, the variable resistor 231=100 kΩ, the semifixed resistor 236'=50 kΩ (after adjustment 25 kΩ), and the semifixed resistor 238'=500 kΩ (after adjustment 250 kΩ) were selected. Furthermore, in order to attain VL=8 to 9 V in the FIG. 13 embodiment, the voltage Vdd=10 V, the capacitor 232=0.4 μF, the variable resistor 231=100 kΩ, and the semifixed resistor 236'=50 kΩ (after adjustment 35 kΩ) were selected. In order to attain VL=1.5 V and VH=25 V in the FIG. 14 embodiment, the voltage Vdd=10 V, the capacitor 232=0.4 μF, the variable resistor 231=100 kΩ, the semifixed resistor 236''=5 kΩ (after adjustment 3 kΩ), and the semifixed resistor 238'=500 kΩ (after adjustment 300 kΩ) were selected. The FIG. 15 embodiment was the same as the FIG. 14 embodiment, except that the variable resistor 238'' has been omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A station selecting apparatus of a voltage synthesizer type for supplying a tuning voltage to an electronic tuner including a voltage controlled variable reactance device as a tuning element,
    said station selecting apparatus comprising
        a memory,
        channel signal generating means for generating and presetting a channel signal to said memory,
        read means for reading said channel signal as necessary from said memory,
        tuning voltage generating means for generating said tuning voltage responsive to a channel signal read from said read means, and
    said channel signal generating means comprises
        charging/discharging circuit means having capacitor means and variable resistor means, a time constant of which is changeable by said variable resistor, a different channel signal being generated responsive to said time constant, and
        semifixed resistor means connected in series with said variable resistor means for defining a lower limit of said time constant, thereby to define a lower limit of said tuning voltage.

2. A station selecting apparatus in accordance with claim 1, wherein
    said tuner is capable of receiving a plurality of frequency bands, and said station selecting apparatus comprises receiving characteristic setting means for setting a receiving characteristic such that the tuning voltage corresponding to the lowest channel of a band requiring said restriction of the lower limit of said tuning voltage may be lower than the tuning voltage corresponding to the lowest channel of another band.

3. A station selecting apparatus in accordance with claim 2, wherein
    said channel signal generating means comprises further semifixed resistor means connected in parallel with said variable resistor means for defining an upper limit of said time constant, thereby to define an upper limit of said tuning voltage.

4. A station selecting apparatus in accordance with claim 3, wherein
    said tuner is capable of receiving a plurality of frequency bands and said station selecting apparatus comprises receiving characteristic setting means for setting a receiving characteristic such that the tuning voltage corresponding to the highest channel of a band requiring said restriction of the upper limit of said tuning voltage may be higher than the tuning voltage corresponding to the highest channel of another band.

5. A station selecting apparatus in accordance with claim 1, wherein
    said tuner is capable of receiving a plurality of frequency bands, and
    said station selecting apparatus further comprises
        band selecting means, and
        means responsive to selection of said band selecting means for rendering effective said semifixed resistor when a corresponding band is selected.

6. A station selecting apparatus in accordance with claim 3, wherein
    said tuner is capable of receiving a plurality of frequency bands, and
    said station selecting apparatus further comprises
        band selecting means, and
        means responsive to selection of said band selecting means for rendering effective said further semifixed resistor when a corresponding band is selected.

7. A station selecting apparatus of a voltage synthesizer type for supplying a tuning voltage to an electronic tuner including a voltage controlled variable reactance device as a tuning element,
    said station selecting apparatus comprising
        a memory,
        channel signal generating means for generating and presetting a channel signal to said memory,
        read means for reading said channel signal as necessary from said memory,
        tuning voltage generating means for generating said tuning voltage responsive to a channel signal read from said read means, and
    said channel signal generating means comprises
        charging/discharging circuit means having capacitor means and variable resistor means, a time constant of which is changeable by said variable resistor, a different channel signal being generated responsive to said time constant, and
        semifixed resistor means connected in series with said variable resistor means for defining an upper limit of said time constant, thereby to define an upper limit of said tuning voltage.

8. A station selecting apparatus in accordance with claim 7, wherein
said tuner is capable of receiving a plurality of frequency bands, and said station selecting apparatus comprises receiving characteristic setting means for setting a receiving characteristic such that the tuning voltage corresponding to the highest channel of a band requiring said restriction of the upper limit of said tuning voltage may be higher than the tuning voltage corresponding to the highest channel of the other band.

9. A station selecting apparatus in accordance with claim 7, wherein
said tuner is capable of receiving a plurality of frequency bands, and
said station selecting apparatus further comprises
band selecting means, and
means responsive to selection of said band selecting means for rendering effective said semifixed resistor when a corresponding band is selected.

* * * * *